United States Patent
Hsiao et al.

(10) Patent No.: US 9,941,865 B2
(45) Date of Patent: Apr. 10, 2018

(54) METHOD AND CIRCUITRY FOR GENERATING TRIGGER SIGNAL AND ASSOCIATED NON-TRANSITORY COMPUTER PROGRAM PRODUCT

(71) Applicant: MEDIATEK Inc., Hsin-Chu (TW)

(72) Inventors: Keng-Jan Hsiao, Taoyuan (TW); Wen-Chi Chao, Hsinchu (TW); Sheng-Chu Wu, Zhubei (TW); Cheng-Yu Chien, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 153 days.

(21) Appl. No.: 14/992,057

(22) Filed: Jan. 11, 2016

(65) Prior Publication Data

US 2017/0041008 A1    Feb. 9, 2017

Related U.S. Application Data

(60) Provisional application No. 62/202,623, filed on Aug. 7, 2015.

(51) Int. Cl.

| H03B 5/32 | (2006.01) |
|---|---|
| H03K 3/0231 | (2006.01) |
| H03L 7/181 | (2006.01) |
| H03L 7/08 | (2006.01) |
| H03B 5/36 | (2006.01) |
| H03L 1/00 | (2006.01) |

(52) U.S. Cl.
CPC .......... *H03K 3/02315* (2013.01); *H03B 5/36* (2013.01); *H03L 1/00* (2013.01); *H03L 7/08* (2013.01); *H03L 7/181* (2013.01)

(58) Field of Classification Search
CPC .. H03L 7/181; H03L 7/08; H03L 1/00; H03K 3/02315; H03B 5/36
USPC ............................................ 331/158, 116 FE
See application file for complete search history.

(56) References Cited

U.S. PATENT DOCUMENTS

| 8,134,413 B2 | 3/2012 | Filipovic et al. | |
| 2017/0041008 A1* | 2/2017 | Hsiao | ................. H03K 3/02315 |

* cited by examiner

*Primary Examiner* — Arnold Kinkead
(74) *Attorney, Agent, or Firm* — McClure, Qualey & Rodack, LLP

(57) ABSTRACT

A method and circuitry for generating a trigger signal based on an oscillation signal and associated non-transitory computer program product are provided. The method includes following steps. Firstly, a calibration value is obtained according to a reference frequency and a frequency of the oscillation signal, and a counting value is gradually altered from a first initial value to a breakpoint value. Secondly, the counting value is updated to a second initial value when the counting value is equal to the breakpoint value. Then, the counting value is gradually altered from the second initial value to a final value, and the trigger signal is generated when the counting value is equal to the final value.

19 Claims, 5 Drawing Sheets

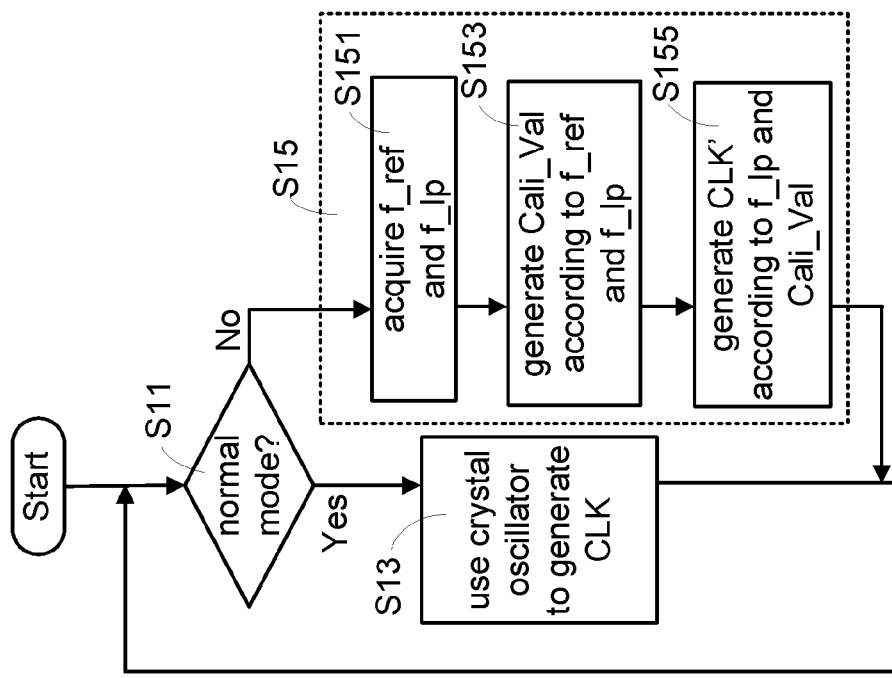
FIG. 3
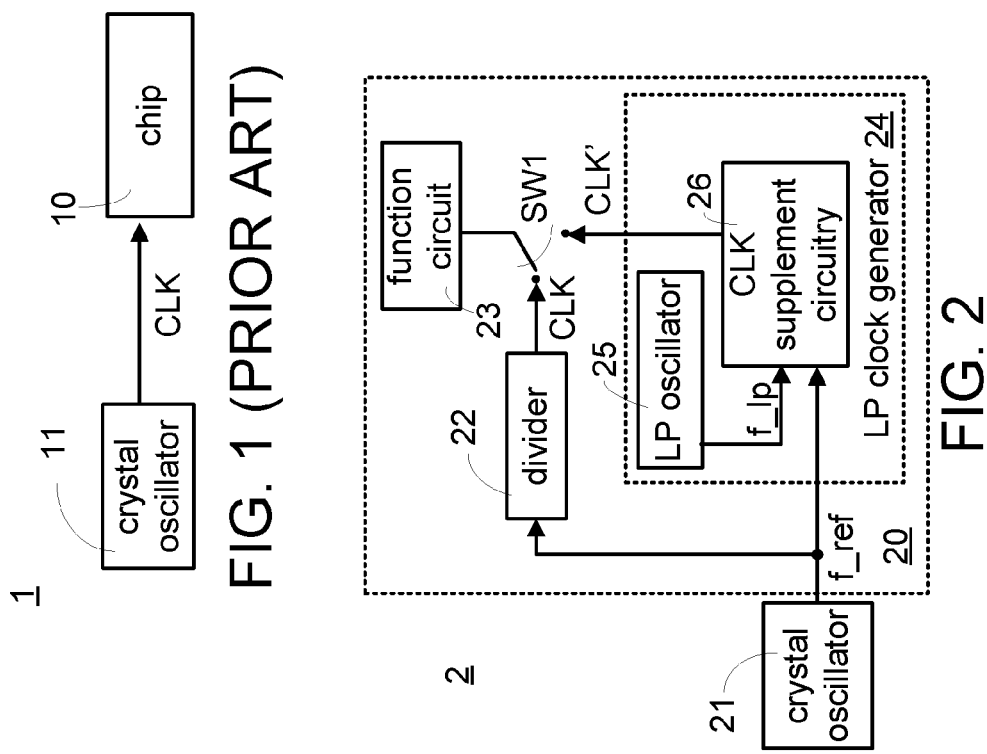
FIG. 1 (PRIOR ART)
FIG. 2

METHOD AND CIRCUITRY FOR GENERATING TRIGGER SIGNAL AND ASSOCIATED NON-TRANSITORY COMPUTER PROGRAM PRODUCT

This application claims the benefit of U.S. provisional application Ser. No. 62/202,623, filed Aug. 7, 2015, the subject matter of which is incorporated herein by reference.

BACKGROUND

Technical Field

The disclosure relates in general to an oscillator, and more particularly to a method and a circuitry for generating a trigger signal based on an oscillation signal and associated non-transitory computer program product.

Description of the Related Art

In electronics and especially synchronous digital circuits, a clock signal oscillating between a high level state and a low level state is essential. FIG. 1 is a schematic diagram illustrating a crystal oscillator used in a digital circuit. Crystal oscillators 11 are widely used for generating clock signals (CLK). A chip 10 of the digital circuit 1 is synchronized by the clock signal (CLK).

The requirement for low power (hereinafter, LP) consumption has been growing at an exponential rate, and many electronic devices provide a power saving mode (for example, standby mode, sleep mode etc.). In order to ensure the electronic product can swiftly change from the power saving mode to a normal mode, the crystal oscillator 11 continues to operate even if the chip 10 is disabled in the power saving mode. However, power assumption of the crystal oscillator 11 is relatively high and should not be neglected.

Since the crystal oscillators consume significant power, on-chip oscillators (for example, LP oscillator) are designed to replace the crystal oscillators in the power saving mode. Although the on-chip oscillators consume less power than the crystal oscillator, frequency of the LP oscillator is not as accurate as frequency of the crystal oscillator. That is to say, the LP oscillator is not suitable for application having tighter frequency tolerances. Consequentially, selecting an oscillator to meet both the requirement of accuracy and low power consumption becomes a dilemma.

SUMMARY

The disclosure is directed to a method and circuitry of low power oscillator and associated non-transitory computer program product.

According to one embodiment, a method used for generating a trigger signal based on an oscillation signal is provided. Firstly, a calibration value is obtained according to a reference frequency and a frequency of the oscillation signal, and a counting value is gradually altered from a first initial value to a breakpoint value. Secondly, the counting value is updated with a second initial value when the counting value is equal to the breakpoint value. The second initial value is determined according to the breakpoint value and the calibration value. Then, the counting value is gradually altered from the second initial value to a final value, and the trigger signal is generated when the counting value is equal to the final value.

According to another embodiment, a circuitry for generating a trigger signal based on an oscillation signal is provided. The circuitry includes a supplement circuitry and a counter. The supplement circuitry obtains a calibration value according to a reference frequency and a frequency of the oscillation signal. Firstly, the counter gradually alters a counting value from a first initial value to a breakpoint value. Then, the counter updates the counting value with a second initial value when the counting value is equal to the breakpoint value. Later, the counter gradually alters the counting value from the second initial value to a final value, and generates the trigger signal when the counting value is equal to the final value. The second initial value is determined according to the breakpoint value and the calibration value.

According to an alternative embodiment, a non-transitory computer program product is provided. The non-transitory computer program product stores code for generating a trigger signal based on an oscillation signal. The code includes: code for obtaining a calibration value according to a reference frequency and a frequency of the oscillation signal; code for gradually altering a counting value from a first initial value to a breakpoint value; code for updating the counting value with a second initial value when the counting value is equal to the breakpoint value, wherein the second initial value is determined according to the breakpoint value and the calibration value; code for gradually altering the counting value from the second initial value to a final value; and code for generating the trigger signal when the counting value is equal to the final value.

BRIEF DESCRIPTION OF THE DRAWINGS

FIG. 1 (prior art) is a schematic diagram illustrating a crystal oscillator used in a digital circuit.

FIG. 2 is a schematic diagram illustrating a digital circuit having two separate sources of clock signals.

FIG. 3 is a flow chart illustrating how origins of the clock signals are selected.

Figure 4A:
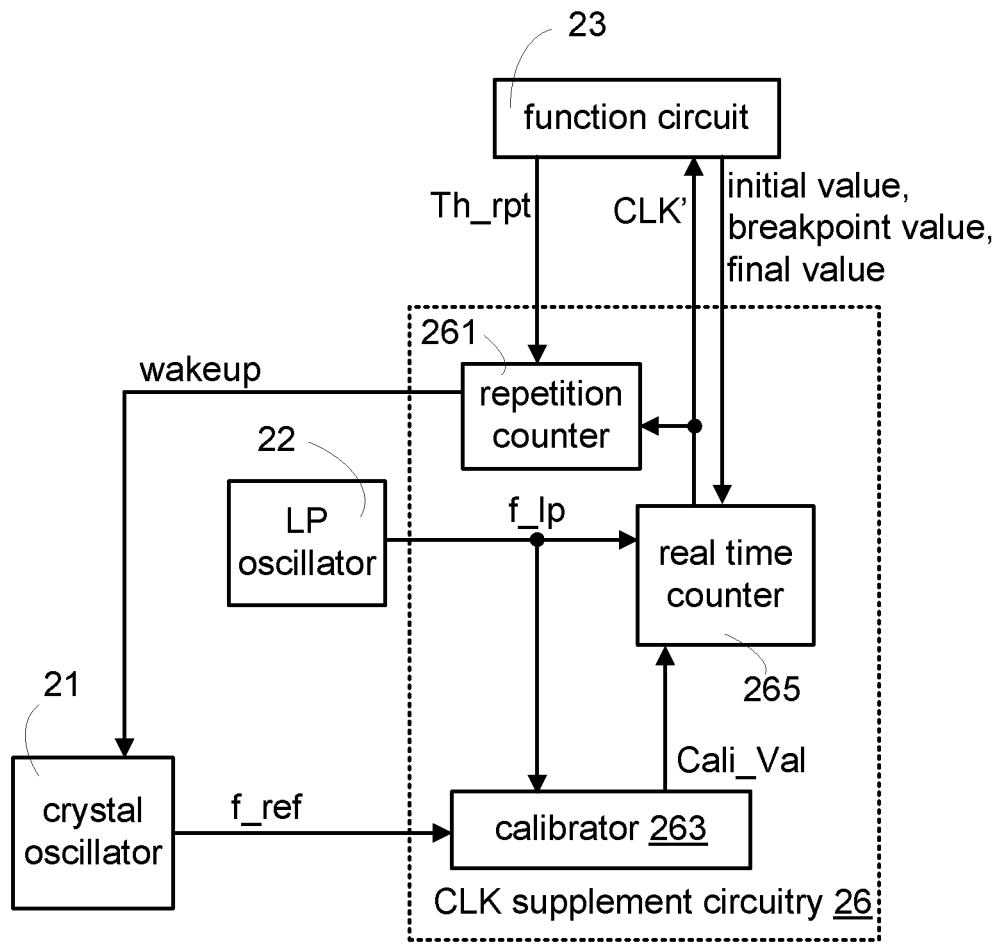
FIG. 4A is a schematic diagram illustrating how the CLK supplement circuitry generates the trigger signal (CLK').

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 2, a digital circuit having two separate sources of clock signals is shown. The digital circuit 2 includes a chip 20 and a crystal oscillator 21. The crystal oscillator 21 generates a reference signal having a reference frequency (f_ref). The chip 20 further includes a function circuit 23, a divider 22, and a low power (LP) clock generator 24 generating a trigger signal (CLK'). A divider ratio of the divider 22 is determined by the reference frequency (f_ref) and frequency of a reference clock signal (CLK). The LP clock generator 24 is composed of an on-chip oscillator (LP oscillator 25) and a CLK supplement circuitry 26. A switch SW1 is switched to connect to the function circuit 23 to one of the divider 22 and the CLK supplement circuitry 26.

When the function circuit 23 is in the normal mode, the function circuit 23 is connected to the divider 22 to receive the reference clock signal (CLK). After receiving the reference signal from the crystal oscillator 21, the divider 22 divides the reference signal with a divider ratio and generates the reference clock signal (CLK).

When the function circuit 12 is in the power saving mode, the function circuit 23 is connected to the CLK supplement circuitry 26 to receive a trigger signal (CLK'). After respectively receiving the reference signal from the crystal oscillator 21 and an oscillation signal from the LP oscillator 25, the CLK supplement circuitry 26 obtains a calibration value (Cali_Val) accordingly. The frequency of the oscillation signal is defined as the oscillation frequency (f_lp). The calibration value (Cali_Val) is further utilized by the CLK supplement circuitry 26 to generate the trigger signal (CLK').

FIG. 3 is a flow chart illustrating how origins of the clock signals are selected. The function circuit 23 firstly determines an operation mode (step S11). Depending on the operation mode of the function circuit 23, one of the reference clock signal (CLK) and the trigger signal (CLK') is selected and fed to the function circuit 23. If the function circuit 23 is in the normal mode, the reference signal is utilized to generate the reference clock signal (CLK) (step S13). Alternatively, if the function circuit 23 is in the power saving mode, the oscillation signal is utilized to generate the trigger signal (CLK') (step S15).

In step S15, the oscillation frequency (f_lp) and the reference frequency (f_ref) are both acquired by the CLK supplement circuitry 26 (step S151). Then, a calibration value (Cali_Val) is calculated according to the reference frequency (f_ref) and the oscillation frequency (f_lp) (step S153). The calibration value (Cali_Val) and the oscillation frequency (f_lp) are further used to generate the trigger signal (CLK') (step S155).

FIG. 4A is a schematic diagram illustrating how the CLK supplement circuitry generates the trigger signal (CLK'). The CLK supplement circuitry 26 includes a repetition counter 261, a real time counter 265, and a calibrator 263.

For the sake of illustration, the repetition counter 261 is assumed to use an up-counting scheme repetitively counting up from an initial repetition value (for example, 0) to a repetition threshold (Th_rpt) (for example, 8). When a repetition counting value (Cnt_rpt) is equal to the repetition threshold (Th_rpt), the repetition counter 261 generates a wakeup signal. The wakeup signal is sent to the crystal oscillator 21. Consequentially, the crystal oscillator 21 is periodically awakened by the wakeup signal.

Once awakened, the crystal oscillator 21 outputs the reference signal to the calibrator 263. Then, the calibrator 263 generates the calibration value (Cali_Val) according to the reference frequency (f_ref) and the oscillation frequency (f_lp). The calibration value (Cali_Val) is transmitted to the real time counter 265. The real time counter 265 proceeds a counting process and outputs the trigger signal (CLK') based on the oscillation signal and the calibration value (Cali_Val). According to the concept of the present disclosure, the frequency of the trigger signal (CLK') is approximately equal to the frequency of the reference clock signal (CLK).

In short, even if the oscillation frequency (f_lp) is not as accurate as the reference frequency (f_ref), accuracy of the trigger signal (CLK') is ensured because the calibration value (Cali_Val) is used to compensate the difference between the oscillation frequency (f_lp) and the reference frequency (f_ref). Details of the counting process are illustrated below. Some parameters can be used in the counting process, for example, a first initial value, a breakpoint value, a second initial value, and a final value. The first initial value, the breakpoint value and the final value are freely selected and can be determined according to type of the real-time counter (up-counting scheme or a down-counting scheme) and the reference frequency (f_ref) etc.

Figure 4B:
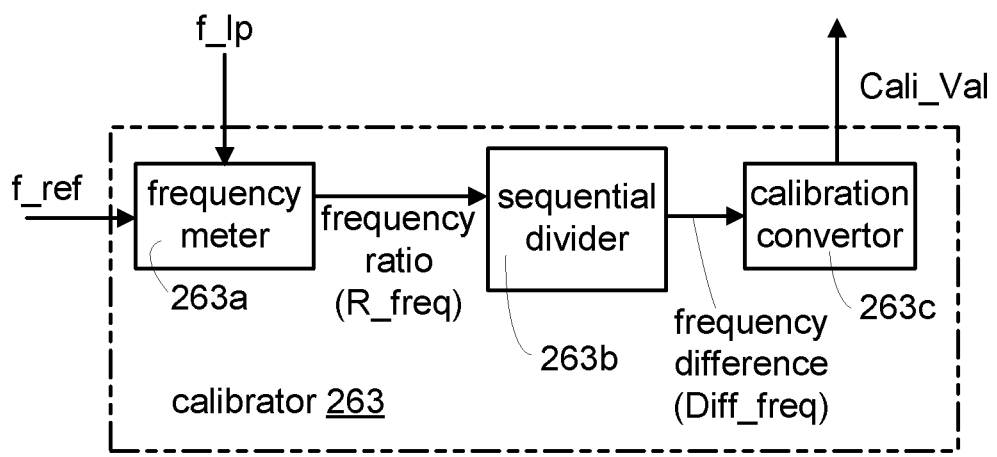
FIG. 4B is a schematic diagram illustrating internal components of the calibrator.

FIG. 4B is a schematic diagram illustrating internal components of the calibrator. The calibrator 263 includes a frequency meter 263*a*, a sequential divider 263*b*, and a calibration convertor 263*c*. The oscillation signal and the reference signal are transmitted to the frequency meter 263*a*. The frequency meter 263*a* respectively detects the reference frequency (f_ref) (for example, 32768 Hz) and the oscillation frequency (f_lp) (for example, 39322 Hz) and accordingly outputs a frequency ratio (R_freq) of these two frequencies (for example, R_freq=f_ref:f_lp=32768 Hz:39322 Hz) to the sequential divider 263*b*.

After receiving the frequency ratio (R_freq), the sequential divider 263*b* generates a frequency difference (Diff_freq) (for example, Diff_freq=32768 Hz−39322 Hz=−6554 Hz). The frequency difference (Diff_freq) is received by the calibration convertor 263*c* and further converted to a calibration value (Cali_Val) (for example, −6554). The calibration value (Cali_Val) (−6554) is further transmitted to the real time counter 265.

The practical implementation of the LP clock generator 24 is flexible and existed components in the digital circuit may be adopted. Therefore, the proposed LP clock generator 24 can provide a low cost solution while accurately generating the trigger signal (CLK'). For example, a power management unit (hereinafter, PMU) may contain the repetition counter 261, the frequency meter 263*a* and the sequential divider 263*b*; and the LP oscillator 25, the calibration convertor 263*c* and the real time counter 265 may be integrated.

Figure 5:
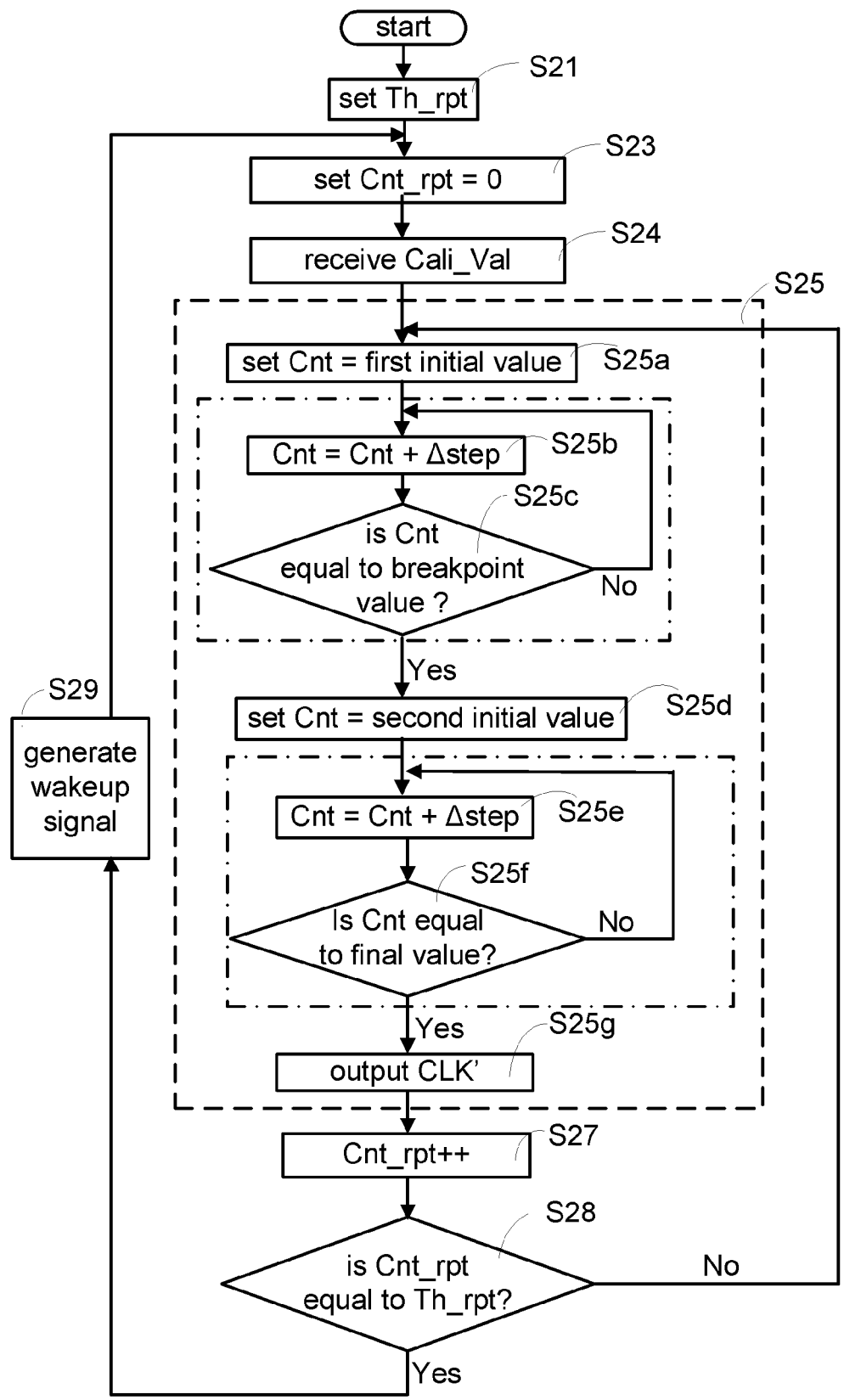
FIG. 5 is a flow chart illustrating operation of the CLK supplement circuitry.

FIG. 5 is a flow chart illustrating operation of the CLK supplement circuitry. Firstly, the function circuit 23 sets a repetition threshold (Th_rpt) (step S21) and sets the repetition counting value (Cnt_rpt) to be the initial counting value (for example, 0) (step S23). Before the real time counter 265 starts to count up/down, the counting value (Cnt) is set to the first initial value (for example, first initial value="1" for an up-counting scheme, or first initial value="32768" for a down-counting scheme) (S25*a*). In addition, the real time counter 265 receives the calibration value (Cali_Val) from the calibrator 263 (step S24).

According to the concept of the present disclosure, the counting process of the real time counter 265 includes three stages, that is, an initial counting stage (first stage), a calibration stage (second stage), and a residue counting stage (third stage). In the initial counting stage and the residue counting stage, the real time counter 265 is gradually altered by a step value (Δstep) in every cycle of the oscillation signal. In the calibration stage, a counting value (Cnt) of the real time counter 265 is updated with a second initial value. The calibration stage is executed in one cycle of the oscillation signal. The second initial value is calculated based on the counting value (Cnt) and the calibration value (Cali_Val). When the counting value (Cnt) is equal to the final value, the real time counter 265 will overflow or underflow and accordingly generate the trigger signal (CLK').

The first stage includes step 25b and step 25c. During the first stage, the counting value (Cnt) is recursively updated by the step value (Δstep). In step S25b, the counting value (Cnt) is obtained by summing an original counting value (Cnt) with the step value (Δstep). The step value (Δstep) can be a positive integer (for example, "1") or a negative integer (for example, "–1"). In step S25c, whether the counting value (Cnt) is equal to the breakpoint value (for example, 16384) is determined. If the counting value (Cnt) is not equal to the breakpoint value, step S25b is repeatedly executed. Thus, at the end of the first stage, the counting value (Cnt) is equal to the breakpoint value.

In the second stage, the counting value (Cnt) is updated with the second initial value (step S25d). The second initial value can be obtained by summing the counting value (Cnt), the step value (for example, Δstep="1"), and the calibration value (Cali_Val). It should noted that the calibration value (Cali_Val) outputted by the calibration convertor 263c may be a positive integer or a negative integer. The summation result of the counting value (Cnt), the step value (Δstep), and the calibration value (Cali_Val) is regarded as the second initial value.

The third stage includes step S25e and step 25f. During the third stage, the counting value (Cnt) is recursively updated by the step value (Δstep). In step S25e, the counting value (Cnt) is increased/decreased by the step value (Δstep). In step S25f, whether the counting value (Cnt) is equal to the final value (for example, 32678) is determined. If the counting value (Cnt) is not equal to the final value, step S25e is repeatedly executed. At the end of the third stage, the counting value (Cnt) is equal to the final value.

The real time counter may overflow (based on an up-counting scheme) or underflow (based on a down-counting scheme). In step S25g, the overflow or the underflow of real time counter 265 is used to generate the trigger signal (CLK'). The trigger signal (CLK') is transmitted to the function circuit 23 and the repetition counter 261. The function circuit 23 utilizes the trigger signal (CLK') for synchronization. When the repetition counter 261 receives the trigger signal (CLK'), the repetition counting value (Cnt_rpt) is increased by one (step S27).

Then, whether the repetition counting value (Cnt_rpt) is equal to the repetition threshold (Th_rpt) is determined (step S28). If step S28 is not satisfied, the calibration value (Cali_Val) is considered as still valid and step S25 is repeatedly executed. If step S28 is satisfied, the repetition counter 261 will generate a wakeup signal. (step S29). The wakeup signal is outputted to the crystal oscillator 21 to awake the crystal oscillator 21. Being awakened by the wakeup signal, the crystal oscillator 21 generates and outputs the reference signal. In consequence, the reference signal is transmitted to the CLK supplement circuitry 26, and step S23 is repeatedly executed. After the CLK supplement circuitry 26 receives the reference signal, the crystal oscillator 21 returns to the power saving mode. In order to save power consumption caused by the crystal oscillator 21, the calibration value (Cali_Val) is calculated only when the repetition counting value (Cnt_rpt) is equal to the repetition threshold (Th_rpt).

In a case that the reference frequency (f_ref) of the crystal oscillator 21 is 32768 Hz, the divider ratio of the divider 22 can be set to 32768. The frequency of the reference clock signal (CLK) is equal to the result of dividing the reference frequency (f_ref) (32768 Hz) by the divider ratio (32768), that is, 1 Hz. Thus, cycle of the reference clock signal (CLK) is equal to 1 second, and cycle of the trigger signal (CLK') is approximate to 1 second.

In addition, the repetition counter 261 counts up the repetition counting value (Cnt_rpt) by one whenever receiving the trigger signal (CLK'). Because the repetition threshold (Th_rpt) is assumed to be "8" and the repetition counter 261 counts up every cycle of the trigger signal (that is, 1 second), the repetition counter 261 overflows every 8 seconds. Therefore, the crystal oscillator 21 is awaken in an interval of 8 seconds, and the calibration value (Cali_Val) is updated every 8 seconds.

Basically, the calibration value (Cali_Val) is utilized to compensate the difference between the oscillation frequency (f_lp) and the reference frequency (f_ref). When the oscillation frequency (f_lp) is greater than the reference frequency (f_ref), the calibration value (Cali_Val) must be used to extend the duration of generating the trigger signal (CLK'). When the oscillation frequency (f_lp) is less than the reference frequency (f_ref), the calibration value (Cali_Val) must be used to shorten the duration of generating the trigger signal (CLK').

Figure 6A:
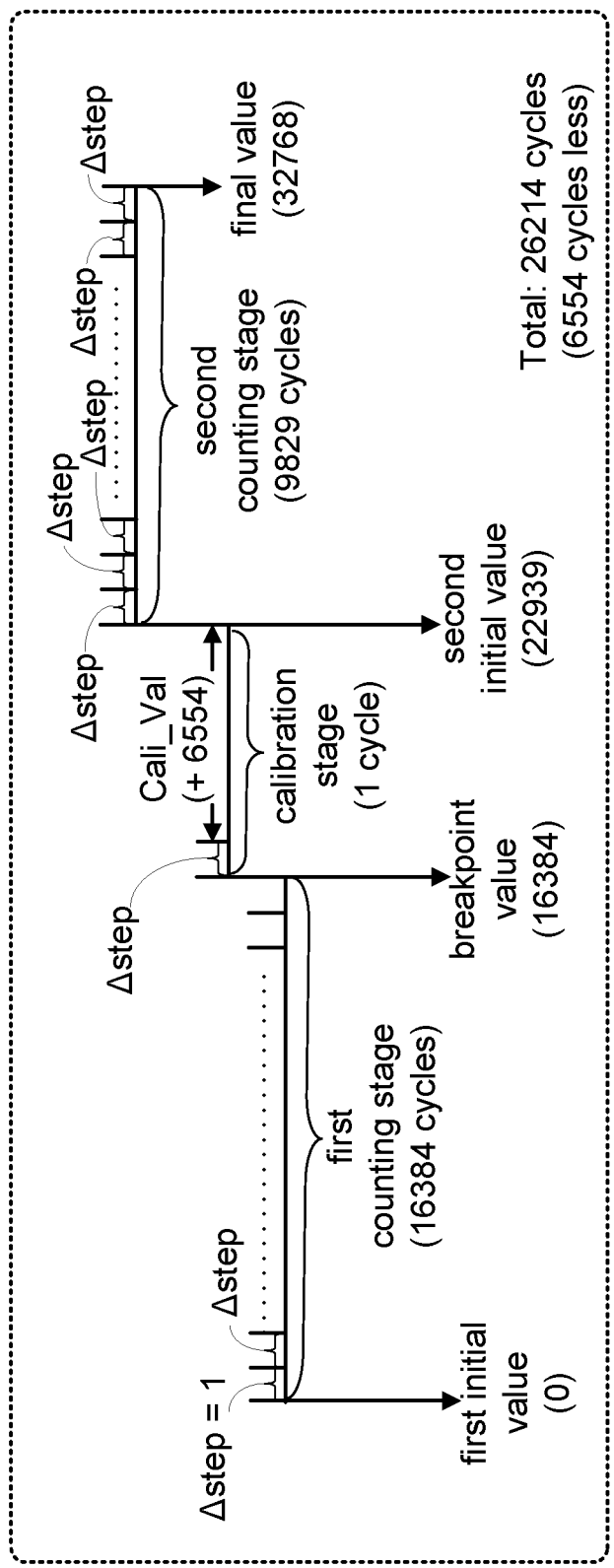
FIG. 6A is a schematic diagram illustrating how a positive calibration value changes the duration of generating the trigger signal (CLK').
Figure 6B:
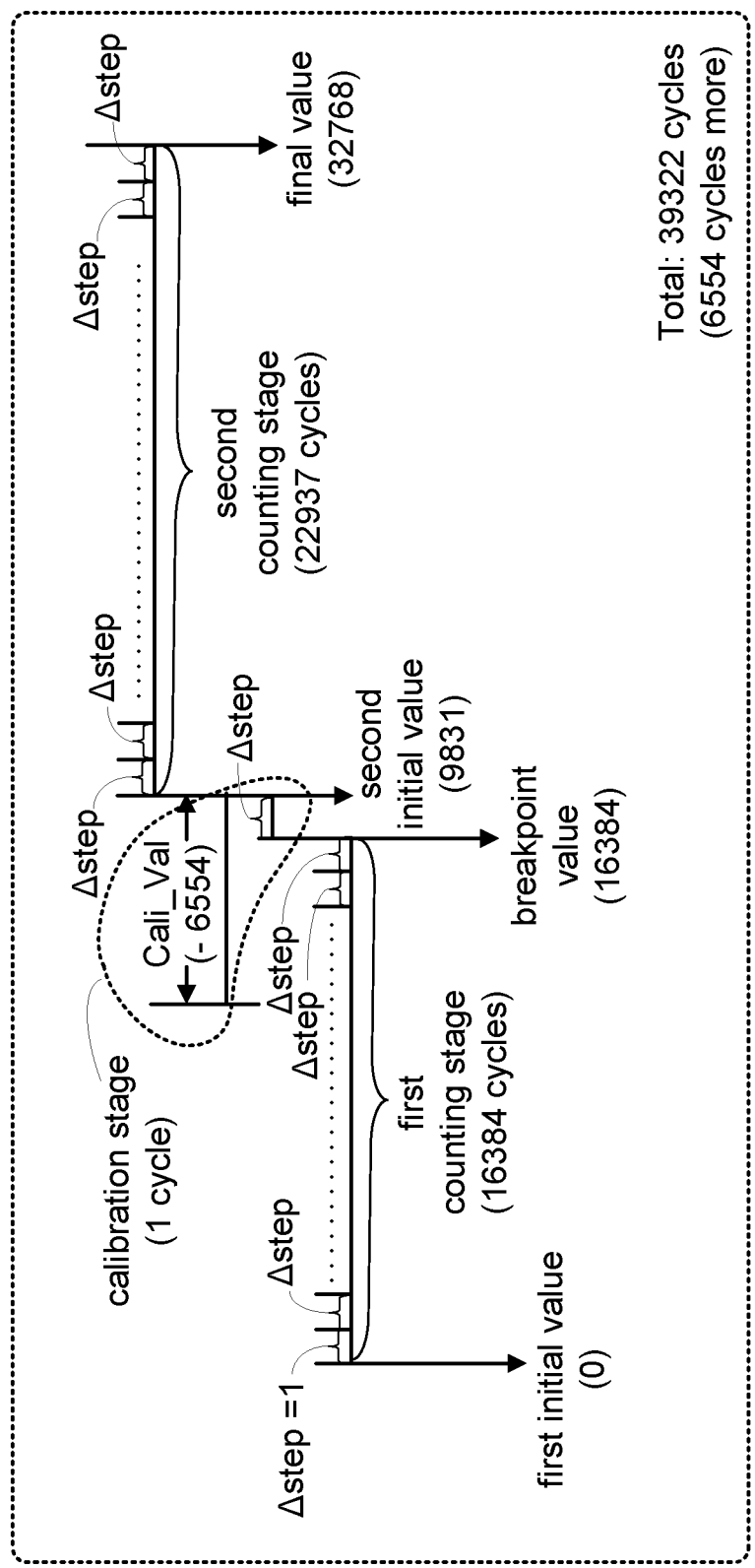
FIG. 6B is a schematic diagram illustrating how a negative calibration value changes the duration of generating the trigger signal (CLK').

FIGS. 6A and 6B visually illustrate how the calibration values affect the duration of generating the trigger signal (CLK'). In both FIGS. 6A and 6B, the real time counter 265 is based on the up-counting scheme. The first initial value of the counting value is assumed to be "0", the final value of the counting value is assumed to be "32768", and the breakpoint value is assumed to be "16384".

FIG. 6A is a schematic diagram illustrating how a positive calibration value changes the duration of generating the trigger signal (CLK'). The frequency ratio outputted by the frequency meter 263a is assumed to be 1:0.8. As the reference frequency (f_ref) is assumed to be 32768 Hz, the oscillation frequency (f_lp) is 26214 Hz (32768 Hz≈0.8 ÷ 26214 Hz). Because the oscillation frequency (f_lp) is 20% lower than the reference frequency (f_ref) of the crystal oscillator 21, cycle of the oscillation signal is 20% longer than that of the reference signal. If the real time counter 265 outputs the trigger signal (CLK') every 32768 cycles as the divider 22 does for outputting the reference clock signal (CLK), the duration of generating the trigger signal (CLK') will be 20% longer than the cycle of the reference clock signal (CLK). Under such circumstances, the duration of generating the trigger signal (CLK') must be shrunk by 20%. Thus, 20% of the cycle count (6554 cycles) must be subtracted, and the calibration value is +6554.

In the initial counting stage, the real time counter 265 counts up from the first initial value (0) to the breakpoint value (16384), and 16384 cycles (16384−0=16384) are required. In the calibration stage, the counting value (Cnt) is updated with the second initial value (22939). The second initial value (22939) is determined by summing up the counting value (16384), the step value (Δstep=1), and the calibration value (+6554). That is, 16384+1+6554=22939. The calibration stage needs one cycle. In the residue counting stage, the real time counter 265 counts up from the second initial value (22939) to the final value (32768), and 9829 cycles (32768−22939=9829) are required. In short, the whole counting process requires 26214 cycles (16384+1+9829=26214) of the oscillation signal.

In other words, even if the cycle of the oscillation signal is 20% longer than the cycle of the reference signal, the cycle count (26214 cycles) required by the real time counter 265 to generate the trigger signal (CLK') is 6554 cycles (20%) less than the cycle count (32768) required by the divider 22 to generate the reference clock signal (CLK). As a whole, the duration required to generate the trigger signal (CLK') is equal to the cycle of the reference clock signal (CLK).

FIG. 6B is a schematic diagram illustrating how a negative calibration value changes the duration of generating the trigger signal (CLK'). The frequency ratio outputted by the frequency meter 263a is assumed to be 1:1.2. As the reference frequency (f_ref) is assumed to be 32768 Hz, the oscillation frequency (f_lp) is 39322 Hz (32768 Hz*1.2≈39322 Hz). Because the oscillation frequency (f_lp) is 20% higher than the reference frequency of the crystal oscillator 21, cycle of the oscillation signal is 20% shorter than that of the reference signal. If the real time counter 265 outputs the trigger signal (CLK') every 32768 cycles as the divider 22 does for outputting the reference clock signal (CLK), the duration of generating the trigger signal (CLK') will be 20% shorter than the cycle of the reference clock signal (CLK). Under such circumstances, the duration of generating the trigger signal (CLK') must be extended by 20%. Thus, extra 20% of the cycle count (6554 cycles) must be inserted, and the calibration value is −6554.

In the initial counting stage, the real time counter 265 counts up from the first initial value (0) to the breakpoint value (16384), and 16384 cycles (16384−0=16384) are required. In the calibration stage, the counting value (Cnt) is updated with the second initial value (9831). The second initial value is determined by summing up the counting value (16384), the step value (Δstep=1), and the calibration value (−6554). That is, 16384+1−6554=9831. The calibration stage needs one cycle to execute. In the residue counting stage, the real time counter 265 counts up from the second initial value (9831) to the final value (32768), and 22937 cycles (32768−9831=22937) are required. In short, the whole counting process requires 39322 cycles (16384+1+22937=39322) of the oscillation signal.

In other words, even if the cycle of the oscillation signal is 20% shorter than the cycle of the reference signal, the cycle count (39322 cycles) required by the real time counter 265 to generate the trigger signal (CLK') is 6554 cycles (20%) more than the cycle count (32768) required by the divider 22 to generate the reference clock signal (CLK). As a whole, the duration required to generate the trigger signal (CLK') is equal to the cycle of the reference clock signal (CLK).

Based on the descriptions of FIGS. 6A and 6B, the calibration value (Cali_Val) is used to change cycle counts required to generate the trigger signal (CLK'). When the real time counter 265 is an up-counting counter, the step value (Δstep) is a positive integer, the first initial value is less than the breakpoint value, and the breakpoint value is less than the final value. Furthermore, a positive calibration value and a negative calibration value will respectively decrease and increase the cycle count required for generating the trigger signal (CLK'). Alternately, when the real time counter 265 is a down-counting counter, the step value (Δstep) is a negative integer, the first initial value is greater than the breakpoint value, and the breakpoint value is greater than the final value. Furthermore, a positive calibration value and a negative calibration value will respectively increase and decrease the cycle count required for generating the trigger signal (CLK').

As the calibration value (Cali_Val) can be a positive integer or a negative integer, the breakpoint value may be greater than or less than the second initial value. Moreover, when any of the reference frequency (f_ref), the divider ratio, and the frequency of the reference clock signal (CLK) changes, the settings of the first initial value, the final value, and the breakpoint value may vary.

The oscillation frequency (f_lp) is not as accurate as the reference frequency (f_ref). The above embodiments illustrate how the calibration value (Cali_Val) is acquired to compensate the inaccuracy of the oscillation frequency (f_lp). Consequentially, the trigger signal (CLK') can be accurately generated in the power saving mode. According to the concept of the present disclosure, the power consumption issue is solved by turning the crystal oscillator into power saving mode, and the accuracy of the output of the LP oscillator can be improved. Therefore, the dilemma between power consumption and accuracy of clock can be solved.

As will be appreciated by one skilled in the art, aspects of the present invention may be embodied as a system, method or non-transitory computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a non-transitory computer program product embodied in one or more computer readable medium(s) having computer readable program code embodied thereon.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for generating a trigger signal based on an oscillation signal, comprising steps of:
    obtaining a calibration value according to a reference frequency and a frequency of the oscillation signal;
    gradually altering a counting value from a first initial value to a breakpoint value;
    updating the counting value with a second initial value when the counting value is equal to the breakpoint value, wherein the second initial value is determined according to the breakpoint value and the calibration value;
    gradually altering the counting value from the second initial value to a final value; and
    generating the trigger signal when the counting value is equal to the final value.

2. The method according to claim 1, wherein the first initial value is less than the breakpoint value, and the second initial value is less than the final value.

3. The method according to claim 2, wherein
    when the reference frequency is higher than the frequency of the oscillation signal, the calibration value is a positive integer; or
    when the reference frequency is lower than the frequency of the oscillation signal, the calibration value is a negative integer.

4. The method according to claim 1, wherein the first initial value is greater than the breakpoint value, and the second initial value is greater than the final value.

5. The method according to claim 4, wherein
    when the reference frequency is higher than the frequency of the oscillation signal, the calibration value is a negative integer; or
    when the reference frequency is lower than the frequency of the oscillation signal, the calibration value is a positive integer.

6. The method according to claim 1, wherein the counting value is gradually altered by a step value.

7. The method according to claim 1, wherein the step of obtaining the calibration value according to the reference frequency and the frequency of the oscillation signal further comprises steps of:
   receiving the oscillation signal from a low power oscillator;
   receiving a reference signal having the reference frequency from a crystal oscillator; and
   converting a difference between the frequency of the oscillation signal and the reference frequency to the calibration value.

8. The method according to claim 7, further comprising steps of:
   periodically transmitting a wakeup signal to the crystal oscillator when the trigger signal is generated.

9. The method according to claim 1, wherein the first initial value and the final value are determined according to a frequency of the trigger signal and the frequency of the oscillation signal.

10. A circuitry for generating a trigger signal based on an oscillation signal, comprising:
    a supplement circuitry, for obtaining a calibration value according to a reference frequency and a frequency of the oscillation signal; and
    a counter, for gradually altering a counting value from a first initial value to a breakpoint value, updating the counting value with a second initial value when the counting value is equal to the breakpoint value, gradually altering the counting value from the second initial value to a final value, and generating the trigger signal when the counting value is equal to the final value,
    wherein the second initial value is determined according to the breakpoint value and the calibration value.

11. The circuitry according to claim 10, wherein the first initial value is less than the breakpoint value, and the second initial value is less than the final value.

12. The circuitry according to claim 11, wherein
    when the reference frequency is higher than the frequency of the oscillation signal, the calibration value is a positive integer; or
    when the reference frequency is lower than the frequency of the oscillation signal, the calibration value is a negative integer.

13. The circuitry according to claim 10, wherein the first initial value is greater than the breakpoint value, and the second initial value is greater than the final value.

14. The circuitry method according to claim 13, wherein
    when the reference frequency is higher than the frequency of the oscillation signal, the calibration value is a negative integer; or
    when the reference frequency is lower than the frequency of the oscillation signal, the calibration value is a positive integer.

15. The circuitry according to claim 10, wherein the supplement circuitry comprises:
    a frequency meter, for generating a frequency ratio between the frequency of the oscillation signal and the reference frequency;
    a sequential divider, for converting the frequency ratio to a frequency difference; and
    a calibration convertor, for converting the frequency difference to the calibration value.

16. The circuitry according to claim 10, wherein the circuitry respectively receives the oscillation signal from a low power oscillator, and a reference signal having the reference frequency from a crystal oscillator.

17. The circuitry according to claim 16, wherein the supplement circuitry periodically transmits a wakeup signal to the crystal oscillator when the trigger signal is generated.

18. The circuitry according to claim 10, wherein the first initial value and the final value are determined according to a frequency of the trigger signal and the frequency of the oscillation signal.

19. The circuitry according to claim 10, wherein the counting value is gradually altered by a step value.

* * * * *